(12) United States Patent
Proesel et al.

(10) Patent No.: US 8,879,927 B2
(45) Date of Patent: Nov. 4, 2014

(54) OPTICAL RECEIVER BASED ON A DECISION FEEDBACK EQUALIZER

(75) Inventors: Jonathan E. Proesel, Yorktown Heighrs, NY (US); Alexander V. Rylyakov, Mount Kisco, NY (US); Clint L. Schow, Ossining, NY (US); Yurii A. Vlasov, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 800 days.

(21) Appl. No.: 13/039,026

(22) Filed: Mar. 2, 2011

(65) Prior Publication Data

US 2012/0224868 A1    Sep. 6, 2012

(51) Int. Cl.
  *H04B 10/06*     (2006.01)
  *H04L 25/03*     (2006.01)
  *H03F 3/08*      (2006.01)
  *H04B 10/69*     (2013.01)

(52) U.S. Cl.
  CPC ............ *H03F 3/08* (2013.01); *H04L 25/03057* (2013.01); *H04B 10/6971* (2013.01)
  USPC .......................................... 398/208; 398/209

(58) Field of Classification Search
  USPC .................. 398/208, 209, 211, 210, 214, 202
  See application file for complete search history.

(56) References Cited

U.S. PATENT DOCUMENTS

| | | | |
|---|---|---|---|
| 5,750,980 A | 5/1998 | Swithers et al. | |
| 6,999,688 B1 | 2/2006 | Hui et al. | |
| 7,085,501 B1 | 8/2006 | Rickard et al. | |
| 7,406,269 B2 | 7/2008 | Becker et al. | |
| 2005/0213995 A1 | 9/2005 | Lee et al. | |
| 2006/0115280 A1* | 6/2006 | Chang et al. | 398/208 |
| 2007/0206964 A1 | 9/2007 | Lee et al. | |
| 2010/0225901 A1 | 9/2010 | Kassler et al. | |
| 2010/0284686 A1 | 11/2010 | Zhong | |

OTHER PUBLICATIONS

Takemoto T. et al., "25 Gb/s Parallel CMOS-Based Optical Receiver with Very Low Inter-Channel Crosstalk and Power Consumption", ECOC (2010).
Emami-Neyestanak A., "Design of CMOS Receivers for Parallel Optical Interconnects" (2004).
O'Brien D.C. et al., "Short-Range Optical Wireless Communications", pp. 1-11 (2008-2009).
Sengupta A., "Simulation of 10GbE Multimode Optical Communications Systems", International Wire & Cable Symposium—Proceedings of the 57th IWCS, pp. 320-326 (2009-2010).
U.S. Office Action dated Jun. 24, 2014 from U.S. Appl. No. 13/596,755.

* cited by examiner

*Primary Examiner* — M. R. Sedighian
(74) *Attorney, Agent, or Firm* — Scully, Scott, Murphy & Presser, P.C.; Anne V. Dougherty, Esq.

(57) ABSTRACT

An optical receiver, a method of operating an optical receiver, a correction based transimpedance amplifier circuit, and a method of adjusting an output of a transimpedance amplifier. In one embodiment, the optical receiver comprises an optical-to-electrical converter, a transimpedance amplifier, and a correction circuit. The optical-to-electrical converter is provided for receiving an optical signal and converting the optical signal to an electrical signal. The transimpedance amplifier is provided for receiving the electrical signal from the optical-to-electrical converter and for generating from the electrical signal an amplified electrical signal. The amplified electrical signal has inter symbol interference resulting from a reduced bandwidth of the transimpedance amplifier. The correction circuit is provided for receiving the amplified electrical signal from the transimpedance amplifier and for generating, from the amplified electrical signal, an output signal including corrections for the inter symbol interference in the amplified electrical signal effectively increasing a bandwidth of the optical receiver.

15 Claims, 4 Drawing Sheets

OPTICAL RECEIVER BASED ON A DECISION FEEDBACK EQUALIZER

BACKGROUND OF THE INVENTION

This invention generally relates to optical receivers, and more specifically, to transimpedance circuits used in optical receivers.

Optical receivers are used in a variety of devices such as photodetectors, optical detectors and optical sensors, to convert light to an electric current or voltage. An optical communication receiver starts with a photodiode, the device that converts input light intensity into a proportional electrical current. Typical values of the current are in the range of tens of microamperes, but can be smaller or larger, depending on the application. In order to be useful for the digital processing on the receiving side, this current has to be converted into the voltage domain and amplified. This function is typically performed by a transimpedance amplifier (TIA), followed by a limiting amplifier (LA). After the LA, the signal can be sampled (sliced) in a clocked decision circuit (latch). This completes the optical receiver function at the physical level.

The TIAs must provide sufficient bandwidth, sensitivity, dynamic range, high gain and low noise to achieve good system performance. In a conventional TIA receiver though, the requirements for high gain and low noise are in direct conflict with the requirement of high bandwidth.

One standard approach to increase the bandwidth of the receiver is to place a peaking amplifier immediately after the TIA. While overall bandwidth of the receiver can be increased in this manner, the main drawback of the peaking amplifier is that it will amplify high frequency noise, significantly degrading the input referred current noise and, as a result, dramatically reducing the sensitivity of the receiver.

BRIEF SUMMARY

Embodiments of the invention provide an optical receiver, a method of operating an optical receiver, a correction based transimpedance amplifier, and a method of adjusting an output of a transimpedance amplifier. In one embodiment, the optical receiver comprises an optical-to-electrical converter, a transimpedance amplifier, and a correction circuit. The optical-to-electrical converter is provided for receiving an optical signal and converting the optical signal to an electrical signal. The transimpedance amplifier is provided for receiving the electrical signal from the optical-to-electrical converter and for generating from said electrical signal an amplified electrical signal. The amplified electrical signal has inter symbol interference resulting from a reduced bandwidth of the transimpedance amplifier. The correction circuit is provided for receiving the amplified electrical signal from the transimpedance amplifier and for generating, from the amplified electrical signal, an output signal including corrections for the inter symbol interference in the amplified electrical signal effectively increasing a bandwidth of the optical receiver.

In one embodiment, the correction circuit includes a decision-feedback equalizer (DFE) including a series of time delay feedback loops. In an embodiment, the DFE effectively increases the bandwidth of the optical receiver without adding any noise to said amplified elect.

In an embodiment, the electrical signal from the optical-to-electrical converter has no significant inter symbol interference (ISI), and substantially all of the ISI in the amplified electrical signal is caused by the transimpedance amplifier as the transimpedance amplifier amplifies the electric signal from the optical-to-electrical converter.

In one embodiment, the amplified electric signal from the transimpedance amplifier is not further amplified between the transimpedance amplifier and the correction circuit. In an embodiment, the output signal of the correction circuit is a digital signal, and the correction circuit converts the amplified electrical signal from the transimpedance amplifier to said digital signal using an adjustable voltage threshold level. In an embodiment, the correction circuit adjusts said voltage threshold level to compensate for the inter symbol interference in said amplified electrical signal.

In one embodiment, the correction circuit samples the voltage of the amplified electrical signal, and updates said voltage threshold level on a basis of said samples. For example, each update of said threshold voltage level may be based on a plurality of samples of the voltage of the amplified electrical signal prior to said each update.

In an embodiment, the transimpedance amplifier has a resistance above a defined level to maintain a sensitivity and a gain of the transimpedance amplifier above defined levels, and to facilitate operation of the transimpedance amplifier with an output signal from the optical-to-electrical converter having no inter symbol interference.

Although the tradeoff between TIA gain, noise and bandwidth appears to be fundamental, embodiments of the invention resolve this tradeoff. First, it may be pointed out that the main application of the TIA based optical receiver is digital communication. The receiving system needs to only be able to differentiate a high level ("1") from a low level ("0") at a given data rate. So the high bandwidth is only needed as far as the receiving latch (clocked comparator) can make a correct decision. Second, it may be noted that the thermal noise nature of the input referred noise makes it truly random, while the bandwidth reduction due to RC time of the TIA has a deterministic, predictable effect on the data. The inter-symbol interference (ISI) in digital data resulting from bandwidth limitations in the system is a very well known effect.

Since ISI is a purely deterministic phenomenon, it is possible to correct for it, using wireline communication techniques like decision-feedback equalizer (DFE). The function of the DFE is to essentially move the decision threshold dynamically, based on the previous data history.

The DFEs have been shown to operate at high data rates and they are very effective in correcting for the bandwidth limitations in the system. The net result of the correctly operating DFE is an "open" eye diagram at the output, even though the input data eye diagram is completely "closed", due to severe ISI.

DETAILED DESCRIPTION

Figure 1:
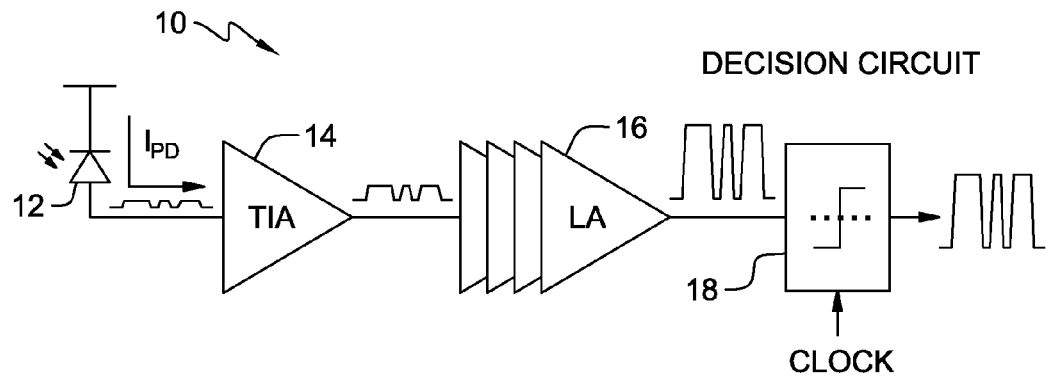
FIG. 1 shows a typical optical receiver block diagram.

A typical optical receiver block diagram is shown in FIG. 1. The optical receiver 10 starts with a photodiode 12, which converts input light intensity into a proportional electric current. Typically the current is in the range of tens of microamperes; and in order to be useful for digital processing, this current is converted into the voltage domain and amplified. This function is performed by a transimpedance amplifier (TIA) 14, followed by a limiting amplifier (LA) 16. After the LA, the signal can be sampled in a clocked decision circuit 18.

Receiver 10 is capable of receiving an optical signal from an optical transmission medium such as an optical fiber or the like, and may comprise an optical-to-electrical (OLE) converter 12 which may comprise, for example, a photodetector or the like, a transimpedance amplifier (TIA) 14, a limiting amplifier (LA) 16, and a clock data recovery module 18. Clock data recovery module 18 may include a clock data and recovery (CDR) circuit coupled to a decoder to provide an electrical output representative of the optical signal received at OLE converter 12.

The electrical signals generated by the photodetector of OLE converter 12 may be relatively weak so they may be converted to a voltage equivalent, as well as being squared-off as digital pulses, regenerating clock signals, and/or noise filtering induced by transmission and dark noise generated by the photodetector of O/E converter 12. The current signal generated by photodetector of O/E converter 12 may be converted into a corresponding voltage for further processing. This conversion may accomplished by TIA 14 which typically may be characterized by a higher transimpedance on the front end and a lower impedance on the back end. TIA 14 provides higher transimpedance with lower noise amplification.

The current signal received by TIA 14 from the photodetector of O/E converter 12 may be relatively small, and TIA 14 may also function as a preamplifier to provide an output signal having an amplitude ranging from about a few millivolts to a about a few hundred millivolts. In optical communications systems, the average power of the received optical signals may vary by orders of magnitude depending on span losses, fiber nonlinearities, and so on. Thus, TIA 14 may be arranged to operate over a wide dynamic range of input currents received from the photodetector of O/E 12.

Limiting amplifier (LA) 16 may function to produce a consistent waveform in response to an input received from TIA 14. Because the input signal received by LA 16 from TIA 14 may still be relatively small, LA 16 may provide a relatively higher gain factor to generate higher output signal levels. Such gain typically may be provided via multiple amplification stages in order to achieve higher stability at higher bandwidths than would otherwise be achieved with a single higher gain amplification stage. LA 16 is capable of increasing the voltage gain of the signals received from TIA 14 to a signal level suitable for CDR circuit 18. CDR circuit 18 is capable of recovering both the data and/or the clock signal embedded in the input data stream received by the photodetector of O/E converter 12.

Figure 2:
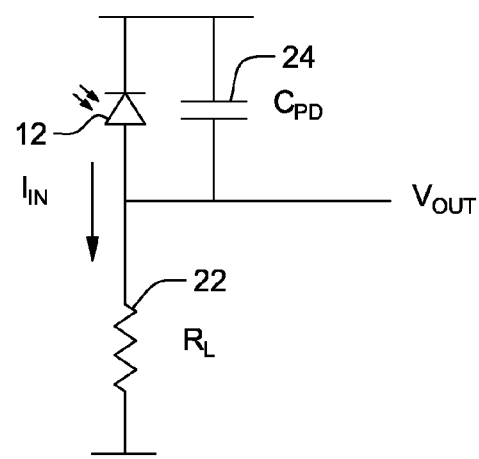
FIG. 2 illustrates a transimpedance converter comprised of a resistor.

The design of the TIA/LA chain involves a number of classical tradeoffs between gain, bandwidth and noise. To illustrate these tradeoffs, we first consider the example of the simplest transimpedance converter—a resistor, as shown in FIG. 2.

The transimpedance gain of the resistor 22 is given by the following equation:

$$\frac{V_{OUT}}{I_{IN}} = R_L$$

Clearly, higher values of $R_L$ will result in higher gain.

The bandwidth of the resistor based receiver shown in FIG. 2 is determined by the RC filter, formed by the resistor $R_L$ and photodiode (or, more generally, photo detector) capacitance $C_{PD}$ 24.

$$BW = \frac{1}{2\pi R_L C_{PD}}$$

In order to achieve the highest possible data rate, the bandwidth has to be as high as possible.

One way to increase the bandwidth is to reduce the photodiode capacitance $C_{PD}$. This is often limited by the size available photo detector, electrical connections to the detector (wirebond pad, etc.), the input capacitance of the TIA, and other parasitic capacitances.

In the silicon photonics scenario, $C_{PD}$ is greatly reduced, due to 1) very small size of the integrated detector and 2) absence of the wirebond pad. There still would remain a small finite value of the order of several fF, due to on-chip parasitics.

When $C_{PD}$ is considered to be fixed, the only way to increase the bandwidth then is to reduce $R_L$. Note, however, that, as described above, reducing $R_L$ will result in reduced gain.

Another key parameter of TIA performance is the total integrated input referred current noise, given by the following equation:

$$|I_{n,in}|^2 = \frac{kT}{R_L^2 C_{PD}}$$

At a given temperature and $C_{PD}$, the only way to improve the input referred noise is to increase $R_L$.

Figure 3:
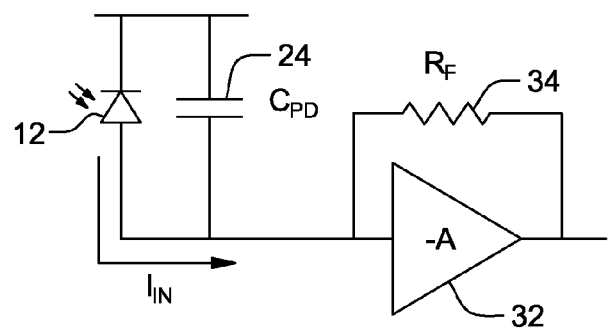
FIG. 3 shows a transimpedance amplifier comprised of an amplifier and a resistor in parallel.

A more realistic practical TIA design is shown in FIG. 3.

The introduction of a gain element 32 helps to somewhat resolve the optimization problem outlined above, although only partially. Gain of the TIA shown in FIG. 3 is given by $$\frac{V_{OUT}}{I_{IN}} = R_F$$

The bandwidth of the design is $$BW = \frac{A}{2\pi R_F C_{PD}}$$

The introduction of gain can help correct for BW reduction resulting from increase in $R_F$ 34. But note that the input referred noise is now given by $$\frac{V_{OUT}}{I_{IN}} = R_F$$

The bandwidth of the design is $$BW = \frac{A}{2\pi R_F C_{PD}}$$

The introduction of gain can help correct for BW reduction resulting from increase in $R_F$ 34. But note that the input referred noise is now given by $$|I_{n,in}|^2 = \frac{kT}{R_F^2 C_{PD}} + \frac{V_{n,A}^2}{R_F^2}$$

The additional term here is the noise of the amplifier.

Thus, in a conventional TIA receiver, the requirements for high gain and low noise are in direct conflict with the requirement of high bandwidth. The present invention addresses this conflict.

First, it may be noted that the main application of the TIA based optical receiver is digital communication. The receiving system needs to only be able to differentiate a high level ("1") from a low level ("0") at a given data rate. So the high bandwidth is only needed as far as the receiving latch (clocked comparator, see FIG. 1) can make a correct decision. Second, it may also be pointed out that the thermal noise nature of the input referred noise makes it truly random, while the bandwidth reduction due to RC time of the TIA has a deterministic, predictable effect on the data. The inter-symbol interference (ISI) in digital data resulting from bandwidth limitations in the system is a very well known effect. it is schematically illustrated in FIG. 4.

Figure 4:
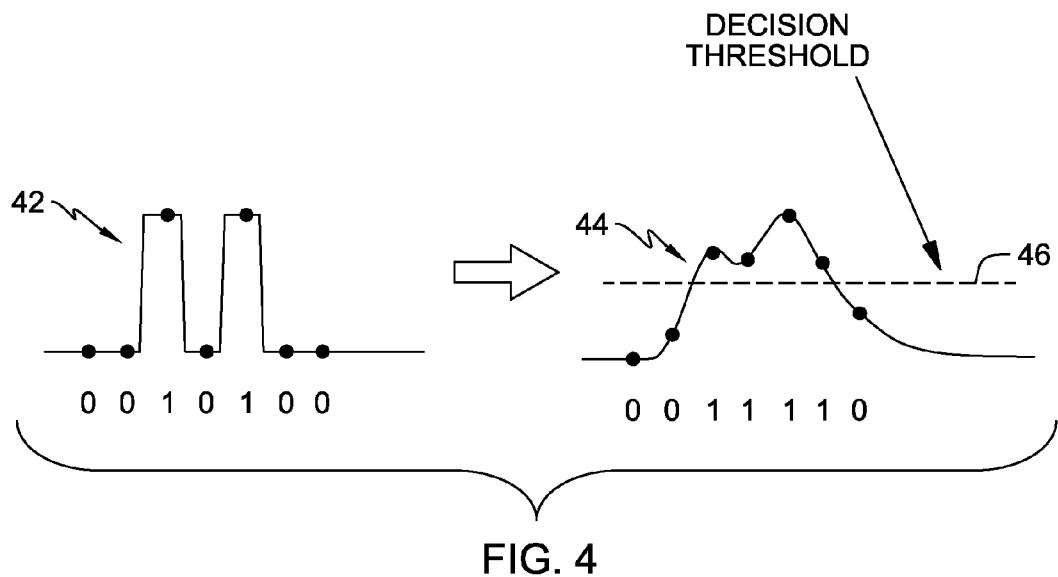
FIG. 4 schematically illustrates inter symbol interference in a digital data stream.

FIG. 4 illustrates at 42 an input digital data stream. This data stream, with inter-symbol interference, is illustrated at 44. As can be seen, the inter-symbol interference in the digital data stream can result in errors when the decision threshold 46 is constant (independent of data history).

Figure 5:
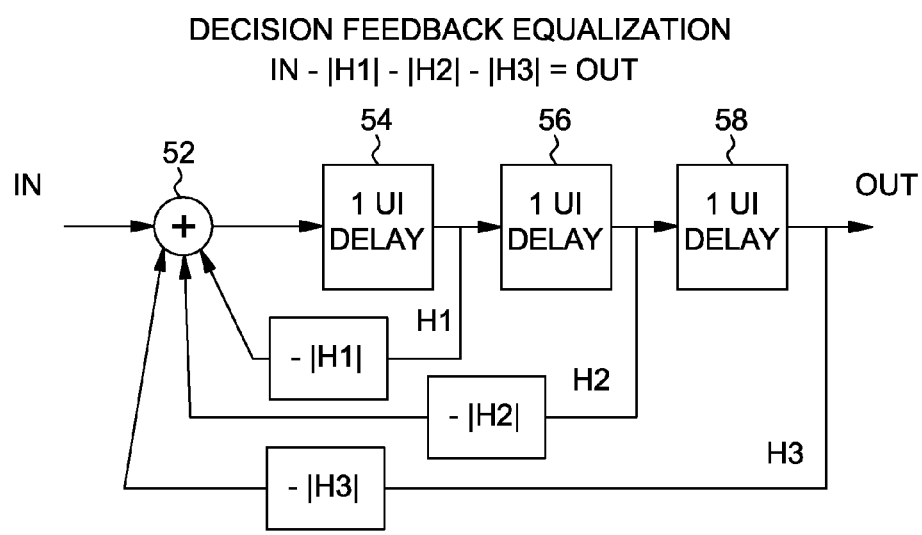
FIG. 5 is a block diagram showing a decision-feedback equalizer.

Since ISI is a purely deterministic phenomenon, it is possible to correct for it, using wireline communication techniques like decision-feedback equalizer (DFE). The function of the DFE is to essentially move the decision threshold dynamically, based on the previous data history. A typical DFE block diagram is shown in FIG. 5.

The DFE is comprised of a summer 52 and a series of delay circuits 54, 56 and 58. A portion of the output of each of the delay circuits is fed back to summer 52, which adds these feedback signals to the input signal.

Figure 6:
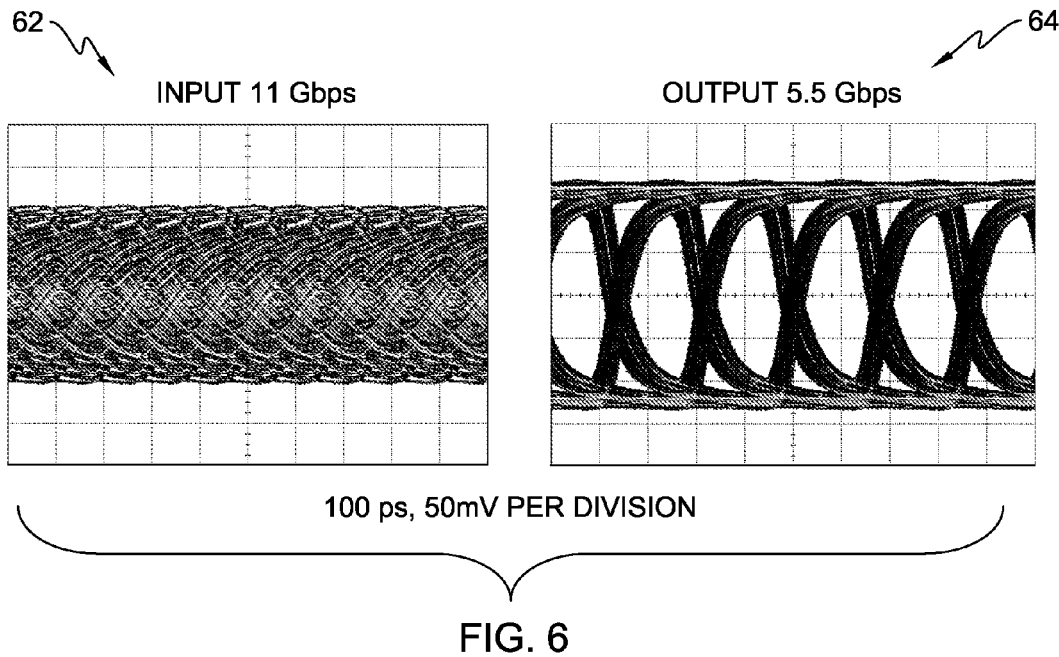
FIG. 6 shows closed and open eye diagrams that are, respectively, inputs to and outputs from the decision-feedback equalizer of FIG. 5.

The DFEs have been shown to operate at high data rates and they are very effective in correcting for the bandwidth limitations in the system. The net result of the correctly operating DFE is an "open" eye diagram at the output, even though the input data eye diagram is completely "closed", due to severe ISI. This point is illustrated in FIG. 6. The DFE with a built-in 1:2 demultiplexer processes an 11 Gbps input data with server ISI (shown at 62) and outputs two clean error-free 5.5 Gbps data streams (shown at 64; only one half-rate 5.5 Gbps output is shown).

Embodiments of the invention address the conflict in the design and operation of the TIA between high gain and low noise, on the one hand, and high bandwidth, on the other hand. This is done by reducing or minimizing the input-referred noise by increasing the value of $R_F$. This increases the TIA sensitivity and gain. The resulting degradation of the TIA bandwidth is corrected with a DFE.

An important difference between this approach and a well-known TIA plus peaking amplifier combination is that, unlike the continuous time equalizer, the DFE does not amplify high-frequency components of the signal, so there is no additional degradation in the value of the input referred noise.

Figure 7:
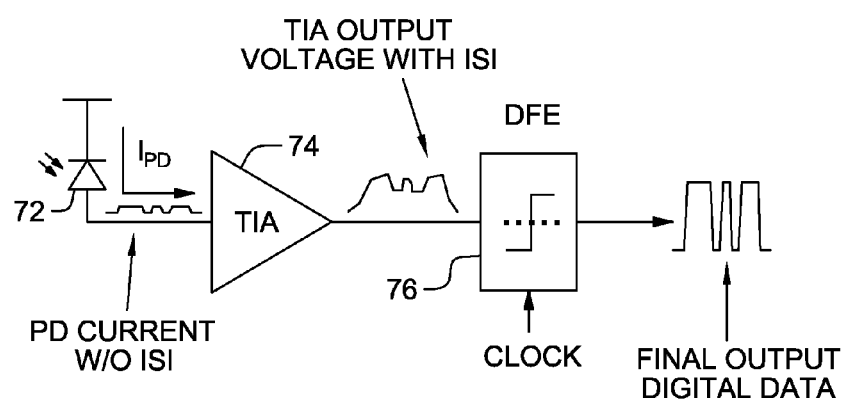
FIG. 7 is a block diagram of an embodiment of the invention.

The overall block diagram of the proposed TIA+DFE receiver is shown in FIG. 7. the input optical data stream has no ISI and it is converted into electrical current in the photodiode (PD) 72. The TIA 14 amplifies this signal and converts it into voltage without attempting to keep the bandwidth adequate for the data rate. The TIA bandwidth can be much smaller (a factor of 10 or more) than what is required to prevent the ISI in the input data stream. The TIA output voltage waveform will have a significant amount of ISI. This signal is applied to the DFE 14 which samples the TIA output voltage, makes digital decisions and continuously updates the decision threshold based on the previous data bits (one or several). Note that, unlike the block diagram shown in FIG. 1, the system of FIG. 7 has no LA's.

With the embodiment of FIG. 7, if LAs were placed after the TIA with severe ISI input, the "0010100" signal shown in FIG. 4 would be driven to "0011110" by the LA, resulting in irreversible loss of information.

Also, the LA's are simply not needed: the gain of the TIA is high and the limiting action happens inside the DFE.

Note that in a standard TIA+LA receiver, most of the power dissipation occurs in the LA's, due to the small gain of the TIA and due to high bandwidth and over system gain requirements. Embodiments of the invention can achieve significant power savings due to the absence of LA's.

Figure 8:
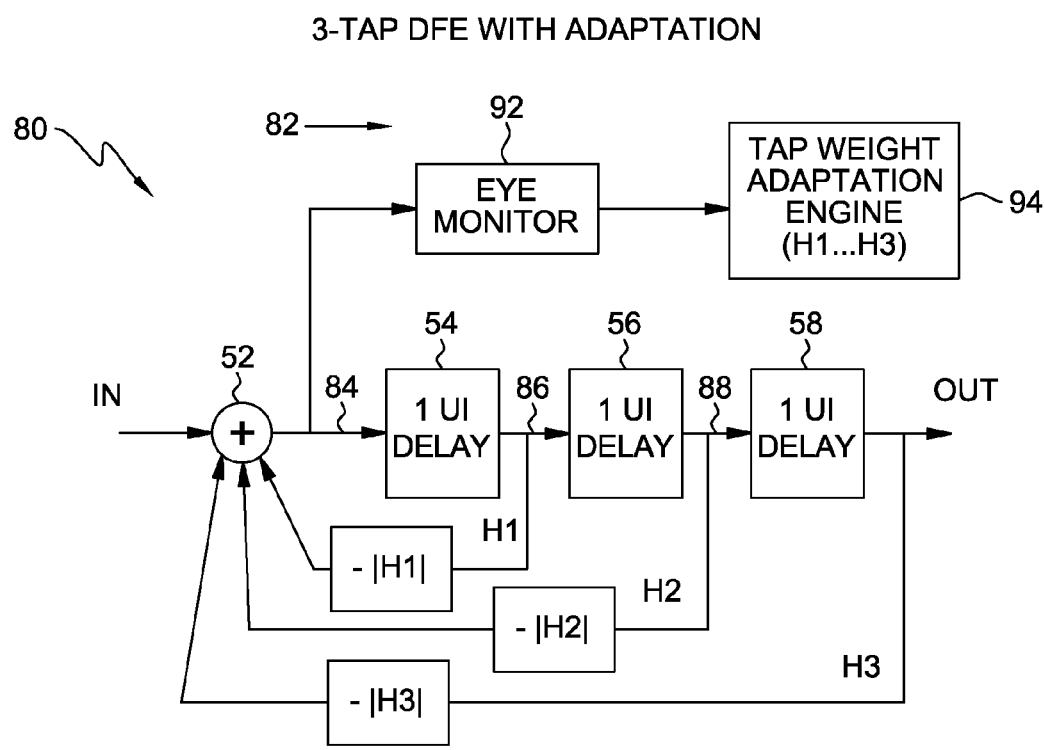
FIG. 8 shows an embodiment of a decision-feedback equalizer that may be used in an embodiment of the invention.

FIG. 8 illustrates, as one example, a decision-feedback equalizer (DFE) 80 that may used in an implementation. As with the DFE of FIG. 5, the DFE of FIG. 8 also includes a summer and a series of delay circuits. FIG. 8 also shows an adaption circuit 82 for adjusting the DFE taps to an optimum point.

As shown in FIG. 8, DEG 80 includes three taps 84, 86 and 88 (although the DEF may include more). Each tap receives the amplified electrical signal from the transimpedance amplifier. Each of the time delay feedback loops 54, 46, 58 receives the amplified electrical signal from a respective one of the taps and introduces a respective one time delay into the amplified electrical signal. With the embodiment of FIG. 8, each of these time delays is one unit interval (UI). Unit Interval is the same as bit period, or the inverse of data rate. For example, at 10 Gbls, the Unit Interval equals 100 ps.

Embodiments of this invention have a wide range of applications in all optical communication systems. Embodiments of the invention are particularly suited for applications in highly integrated silicon photonics designs, where system clock is already available and digital output is expected (as opposed to continuous time output in standalone optical receivers). Additionally, the extremely high sensitivity of the receiver of embodiments of the invention, combined with low capacitance of the integrated photodiode, can result in a very low power, compact, mostly digital solution that can operate at extremely high data rates. The resulting savings in the system optical budget is also very important since the optical power from a single continuous laser source can be split between a larger number of channels.

While it is apparent that the invention herein disclosed is well calculated to achieve the features discussed above, it will be appreciated that numerous modifications and embodiments may be devised by those skilled in the art, and it is intended that the appended claims cover all such modifications and embodiments as fall within the true spirit and scope of the present invention.

The invention claimed is:

1. An optical receiver comprising:
   an optical-to-electrical converter for receiving an optical signal and converting the optical signal to an electrical signal;
   a transimpedance amplifier for receiving the electrical signal from the optical-to-electrical converter and for generating from said electrical signal an amplified electrical signal, said amplified electrical signal having inter symbol interference resulting from a reduced bandwidth of the transimpedance amplifier; and
   a correction circuit for receiving the amplified electrical signal from the transimpedance amplifier and for generating, from the amplified electrical signal, an output signal including corrections for the inter symbol interference in the amplified electrical signal effectively increasing a bandwidth of the optical receiver; and wherein:
   the correction circuit converts the amplified electrical signal from the transimpedance amplifier to the output signal using an adjustable decision threshold level; and
   the correction circuit adjusts said adjustable decision threshold, to compensate for the inter symbol interference in said amplified electrical signal, on the basis of samples of the amplified electrical signal from the transimpedance amplifier.

2. The optical receiver according to claim 1, wherein the correction circuit includes a decision-feedback equalizer (DFE) including a series of time delay feedback loops.

3. The optical receiver according to claim 2, wherein the DFE effectively increases the bandwidth of the optical receiver without adding any noise to said amplified electrical signal.

4. The optical receiver according to claim 2, wherein:
   the DFE includes a plurality of taps, each of said taps receiving the amplified electrical signal; and
   each of the time delay feedback loops receives the amplified electrical signal from a respective one of said taps and introduces a respective one time delay into said amplified electrical signal.

5. The optical receiver according to claim 1, wherein the electrical signal from the optical-to-electrical converter has no significant inter symbol interference (ISI).

6. The optical receiver according to claim 5, wherein the amplified electric signal from the transimpedance amplifier is not further amplified between the transimpedance amplifier and the correction circuit, and substantially all of the ISI in the amplified electrical signal is caused by the transimpedance amplifier as the transimpedance amplifier amplifies the electric signal from the optical-to-electrical converter.

7. The optical receive according to claim 1, wherein:
   the output signal of the correction circuit is a digital signal;
   the correction circuit converts the amplified electrical signal from the transimpedance amplifier to said digital signal using an adjustable voltage threshold level; and
   the correction circuit adjusts said voltage threshold level to compensate for the inter symbol interference in said amplified electrical signal.

8. The optical receiver according to claim 7, wherein:
   the amplified electrical signal from the transimpedance amplifier has a voltage; and
   the correction circuit samples the voltage of said amplified electrical signal, and updates said voltage threshold level on a basis of said samples.

9. The optical receiver according to claim 8, wherein each update of said threshold voltage level is based on a plurality of samples of the voltage of the amplified electrical signal prior to said each update.

10. The optical receiver according to claim 1, wherein the transimpedance amplifier has a resistance above a defined level to maintain a sensitivity and a gain of the transimpedance amplifier above defined levels, and to facilitate operation of the transimpedance amplifier with an output signal from the optical-to-electrical converter having no inter symbol interference.

11. A correction based transimpedance circuit comprising:
    a transimpedance amplifier for receiving an electrical signal in an optical receiver and for generating from said electrical signal an amplified electrical signal, said amplified electrical signal having inter symbol interference resulting from a reduced data bandwidth of the transimpedance amplifier; and
    a correction circuit for receiving the amplified electrical signal from the transimpedance amplifier and for generating, from the amplified electrical signal, an output signal including corrections for the inter symbol interference in the amplified electrical signal effectively increasing a bandwidth of the optical receiver; and wherein:
    the correction circuit converts the amplified electrical signal from the transimpedance amplifier to the output signal using an adjustable decision threshold level; and
    the correction circuit adjusts said adjustable decision threshold, to compensate for the inter symbol interference in said amplified electrical signal, on the basis of samples of the amplified electrical signal from the transimpedance amplifier.

12. The correction based transimpedance circuit according to claim 11, wherein:
    the correction circuit includes a decision-feedback equalizer (DFE) including a series of time delay feedback loops;
    wherein the DFE effectively increases the bandwidth of the optical receiver without adding any noise to said amplified electrical signal.

13. The correction based transimpedance circuit according to claim 11, wherein the amplified electric signal from the transimpedance amplifier is not further amplified between the transimpedance amplifier and the correction circuit.

14. The correction based transimpedance circuit according to claim 11, wherein:
    the output signal of the correction circuit is a digital signal;
    the correction circuit converts the amplified electrical signal from the transimpedance amplifier to said digital signal using an adjustable voltage threshold level; and
    the correction circuit adjusts said voltage threshold level to compensate for the inter symbol interference in said amplified electrical signal.

15. The correction based transimpedance circuit according to claim 14, wherein:
    the amplified electrical signal from the transimpedance amplifier has a voltage; and
    the correction circuit samples the voltage of said amplified electrical signal, and updates said voltage threshold level on a basis of said samples.

* * * * *